(12) United States Patent
Khellah et al.

(10) Patent No.: US 7,385,865 B2
(45) Date of Patent: Jun. 10, 2008

(54) MEMORY CIRCUIT

(75) Inventors: Muhammad M. Khellah, Tigard, OR (US); Dinesh Somasekhar, Portland, OR (US); Yibin Ye, Portland, OR (US); Gunjan H. Pandya, Beaverton, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/001,870

(22) Filed: Dec. 1, 2004

(65) Prior Publication Data

US 2006/0114711 A1    Jun. 1, 2006

(51) Int. Cl.
G11C 7/00 (2006.01)
G11C 11/00 (2006.01)

(52) U.S. Cl. .................. 365/203; 365/154; 365/202

(58) Field of Classification Search ............... 365/154, 365/203
See application file for complete search history.

(56) References Cited

U.S. PATENT DOCUMENTS

| | | | |
|---|---|---|---|
| 5,850,367 A * | 12/1998 | Wada et al. ......... | 365/230.03 |
| 6,456,540 B1 | 9/2002 | Baltar | |
| 6,519,195 B2 * | 2/2003 | Kanno et al. ............ | 365/203 |
| 6,529,400 B1 * | 3/2003 | Bhavnagarwala et al. .. | 365/154 |
| 6,643,199 B1 | 11/2003 | Tang et al. | |
| 6,665,209 B2 * | 12/2003 | Osada et al. ............ | 365/154 |
| 6,711,051 B1 * | 3/2004 | Poplevine et al. ......... | 365/154 |
| 6,930,941 B2 * | 8/2005 | Nakase ................. | 365/205 |
| 2006/0067108 A1 * | 3/2006 | Islam .................. | 365/154 |

OTHER PUBLICATIONS

Bhavnagarwala, A. J. et al., *The Impact of Intrinsic Device Fluctuations on CMOS SRAM Cell Stability*, IEEE Journal of Solid State Circuits, vol. 36, No. 4, Apr. 2001.

Bhavnagarwala, A. J. et al., *Dynamic-Threshold CMOS SRAM Cells for Fast, Portable Applications*, Proceedings of the 14th IEEE International ASIC/SOC Conference, Arlington, VA, Sep. 2000, pp. 359-363.

\* cited by examiner

*Primary Examiner*—Lý Duy Pham

(57) ABSTRACT

In one embodiment, a memory array is provided comprising one or more columns each comprising a plurality of bit cells divided into groups of bit cells with each group of bit cells controllably coupled to a separate bit line.

5 Claims, 5 Drawing Sheets

MEMORY CIRCUIT

TECHNICAL FIELD

Embodiments disclosed herein relate generally to integrated circuit ("IC") devices and in particular to memory circuits that may be employed in such devices.

BACKGROUND

Memory arrays formed from static random access memory ("SRAM") cells are commonly used in many different applications. Such arrays are typically configured into multiple columns of cells with each column of cells sharing a common bit line. For example, with so-called "6T" SRAM cells, which have a pair of complementary storage nodes, a common, complementary bit line pair is commonly utilized. It is typically controllably coupled (e.g., through gate or access transistors) to a relatively large number of cells in a column. When a cell is to be read, the bit line pair is charged to a High level during a precharge state. Next, during an evaluate state, a selected cell to be read is activated (coupled to the bit line pair with its gate transistors turned on) causing one of its bit lines to discharge into a Low node of the selected cell. Unfortunately, in some cases, the bit line discharges in a way that causes the cell to be improperly read. Accordingly, this disclosure provides solutions for addressing such read instability problems.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Figure 1:
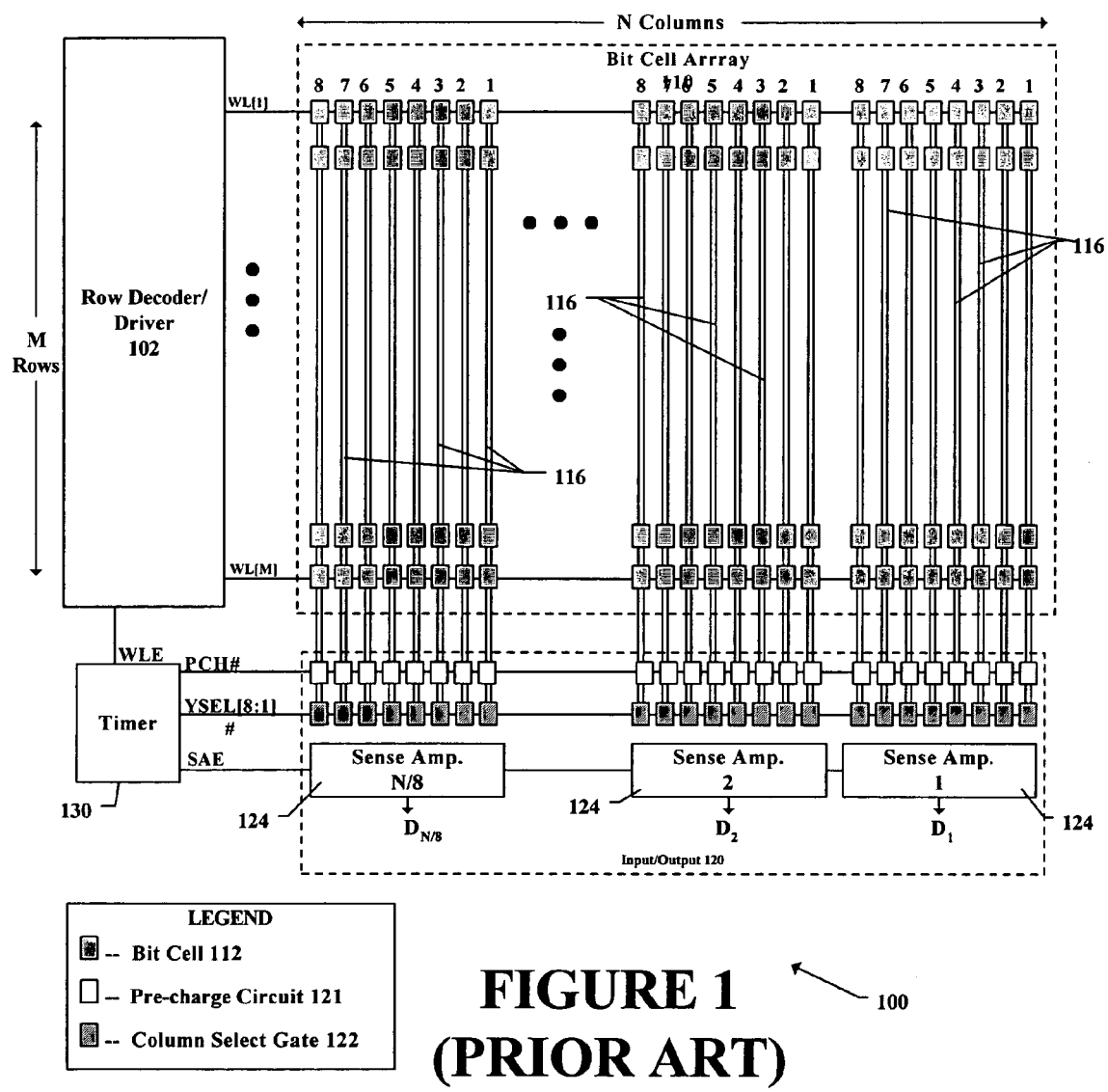
FIG. 1 is a schematic diagram of a conventional memory array circuit.

FIG. 1 shows a conventional memory array circuit 100 having M rows and N columns of memory cells. Memory array circuit 100 includes a row decoder/driver circuit 102, a bit cell array 110, an input/output circuit 120, and a timer circuit 130. The bit cell array 110 includes M rows of bit cells 112 configured into N different columns with each column having a bit line pair 116 and M associated bit cells each controllably coupled to the bit line pair 116. (As used herein, the term: "controllably coupled" means configured to be effectively coupled or decoupled depending upon the state(s) of one or more signals. Any suitable device or device combination, e.g., implementing a gate, switch, multiplexer, or the like, may be used to controllably couple a circuit element to another circuit element. for example, as discussed herein, a bit cell may be controllably coupled to a bit line through a gate such as a gate (or access) transistor.)

The row decoder/driver 102 has word line outputs (WL[1] to WL[M]) applied, respectively, to the 1 through M rows of bit cells 112. When a cell is to be read, row decoder/driver 102 asserts (High) the word line output signal (WL[i]) that is applied to the row containing the bit cell(s) 112 to be read, and the other (non-selected) word line output signals are negated (Low).

The input/output circuit has precharge circuits 121, column select gates 122 and sense amplifiers 124. The precharge circuits 121 are each coupled to an associated bit line pair 116 for controllably charging the bit line pair (e.g., during a precharge state). The column select gates 122 are each interposed between a bit cell column and an associated sense amplifier 124 to controllably couple the bit cell column to the associated sense amplifier when a bit cell in the column is to be accessed. (Note that in this depiction, the column select gates 122 and sense amplifiers 124 are used for read operations. Separate sense amplifiers and column select gates, not shown, may be used for write operations.) In the depicted circuit, one sense amplifier 124 is used for eight separate columns multiplexed to it through the column select gates 122. Thus, with this configuration, the N bit columns define eight separate, N/8-bit words for each row. For example, with a 256 by 256 bit cell array, 32 separate sense amplifiers 124 would output eight separate 32-bit ($D_{32}$ to $D_1$) words for each row.

The timer 130 has a word-line enable (WLE) output coupled to the row decoder/driver 102. It also has a precharge output signal (PCH#) coupled to the precharge circuits 121, column select output signals (YSEL[7:0]#) coupled to corresponding column select gates 122, and a sense amplifier enable (SAE) output signal coupled to the sense amplifiers 124. It controls these signals to implement a read operation for a selected row (1 to M) and word (1 to 8) of bit cells 112.

On a read operation, the bit line pair 116 is charged High during a precharge state. The precharge (PCH#) signal is asserted (Low) to turn on the precharge circuits 121, the eight column select (YSEL[7:0]#) signals are negated (High) to turn off the column select gates 122, and the M word-line signals (WL[1] to WL[M]) are negated (Low) to de-activate the bit cells 112 (i.e., de-couple them from the bit line pair 116). Thereafter, during an evaluate state, a selected one of the word-line signals (corresponding to a row to be read) is asserted (High) thereby causing one of the bit lines from a bit line pair 116 to discharge through an associated bit cell 112 in the selected row. This is done by negating (High) the precharge signal (PCH#) and asserting (High) a selected one of the word line signals (WL[0] to WL[M]) to activate the cells 112 in the selected row. At the same time, a selected one of the column select signals (YSEL[8:1]) is output by the timer to couple a selected one of the eight bit line pairs, associated with each sense amplifier 124, to its associated sense amplifier 124. That is, in the depicted figure, one of every eight bit line pairs 116 is coupled through to its corresponding (or associated) sense amplifier 124.

Figure 3:
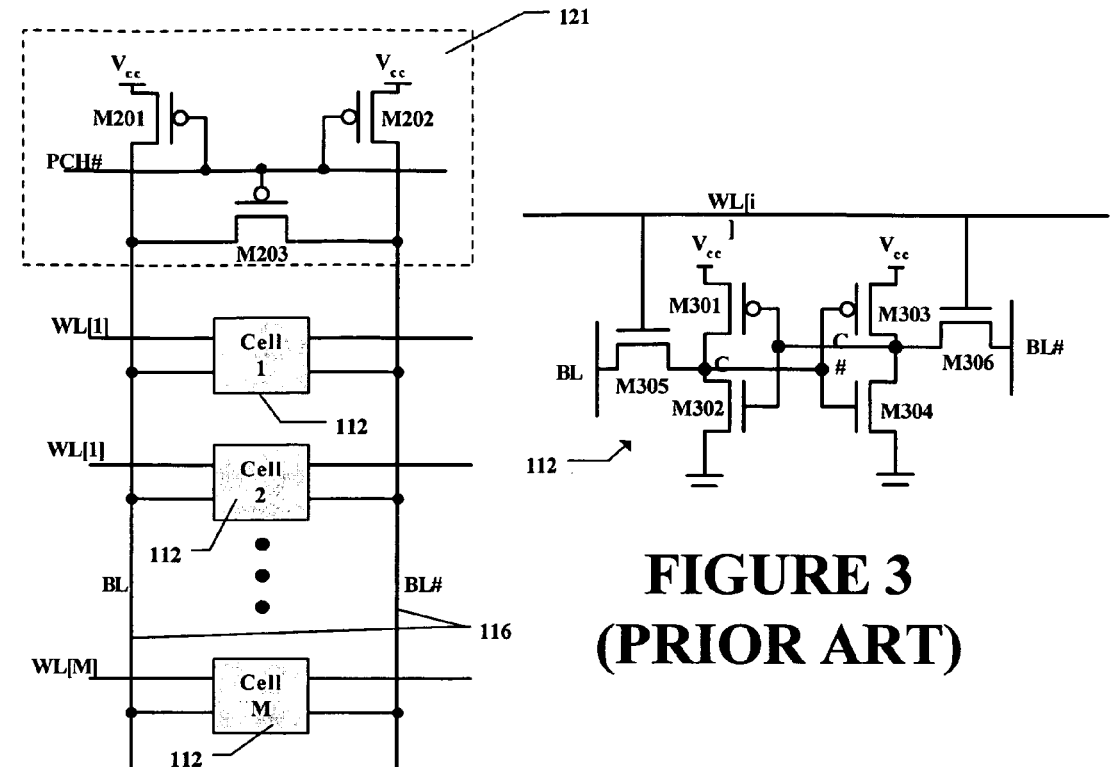
FIG. 3 is a schematic diagram of a conventional 6T SRAM bit cell circuit, which may be used in the memory array circuit of FIG. 1.
Figure 2:
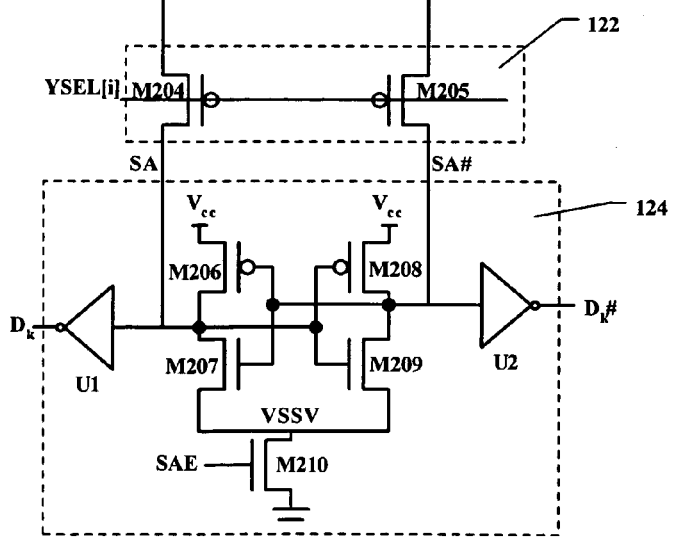
FIG. 2 is a schematic diagram of a conventional bit cell column, which may be used in the memory array circuit of FIG. 1.

With reference to FIG. 2, one embodiment of a cell column that may be used in cell array 110 is depicted. In this figure, circuits for implementing a precharge circuit 121, a column select gate 122, and a sense amplifier 124 are shown. (A circuit for implementing a bit cell 112 is depicted in FIG. 3.)

The depicted precharge circuit 121 is coupled to the bit lines (BL, BL#) to charge them to a High level during a precharge state. (As used herein, a "precharge circuit" refers to any suitable device or device combination configured to charge a bit line or bit line pair to a suitable High level.) Precharge circuit 121 comprises p-type field-effect-transistors ("PFET") transistors M201 to M203 configured, as shown, between a suitable High-level precharge voltage (e.g., $V_{cc}$) and the bit line pair (BL and BL#) 116. When the precharge signal (PCH#) is asserted (Low), the precharge circuit transistors M201 to M203 turn on and couple the precharge voltage ($V_{cc}$) to the pair 116 of bit lines (BL, BL#) to charge them to a High level and to equalize them with one another. (Note that in this figure, the precharge circuit 121 is depicted at the top of the bit line pair 116 for ease of representation. While it could physically be located here, or anywhere along the bit line pair for that matter, in the depicted array of FIG. 1, it is shown as part of the input/output block 120 because it is physically located more proximal to the timer 130 and input/output 120 devices to reduce signal path lengths.)

The depicted column select gate 122 is disposed in each bit cell column and comprises PFET transistors M204, M205 connected between an associated bit line pair 116 and a sense amplifier 124. (As used herein, a "column select gate" refers to any suitable device or device combination configurable to controllably couple/decouple a bit line or a bit line pair to/from a sense amplifier.) When the column select signal (YSEL[i]) corresponding to a column select gate 122 is asserted (Low), transistors M204, M205 turn on and couple the bit line pair 116 to the corresponding sense amplifier 124. Conversely, when the signal is negated (High), the bit line pair 116 is effectively decoupled from the sense amplifier 124.

The depicted sense amplifier 124 comprises pull-up PFET transistors M206, M208, pull-down n-type field-effect-transistor ("NFET") transistors M207, M209, a virtual ground providing NFET transistor M210, and inverters U1, U2. The pull-up and pull-down transistors (M206 to M209) are coupled to one another in a cross-coupled inverter pair configuration with sense nodes at S and S# and a virtual ground node (VSSV) at the drain of NFET transistor M210. The sense nodes (S, S#) are connected to column select gate 122 to be controllably coupled to the BL and BL# nodes, respectively, of a bit line pair 116. They also are respective inputs to inverters U1 and U2, with the output ($D_k$) of inverter U1 functioning as the indicated output for a sense amplifier 124 in FIG. 1.

During an evaluate state, the sense amplifier enable (SAE) signal is asserted (High), which turns on transistor M210 thereby activating the sense amplifier 124. Based on the content of a selected bit cell 112, either the BL or BL# node will start dropping and develop a small differential voltage on the bit line pair 116. This relatively small voltage is "interpreted" by the sense amplifier's cross-coupled inverter pair (M206 to M209) and buffered into a stable, readable output from inverter U1 at $D_k$.

With reference to FIG. 3, a bit cell 112 is depicted. (As used herein, a "bit cell" refers to any suitable device or device combination for implementing a memory cell coupled to a dischargeable bit line or bit line pair.) The depicted bit cell 112 is a so-called 6T SRAM cell, which is a complementary-output (outputs with complementary values) static random access memory ("SRAM") cell. It comprises pull-up, PFET transistors M301, M303, pull-down, NFET transistors M302, M304, access (or gate) NFET transistors M305, M306, a word-line node (WL), and bit line pair nodes (BL, BL#). The pull-up and pull-down transistors M301 to M304 are coupled to form a cross-coupled inverter pair having internal, complementary storage nodes (C and C#). The complementary storage nodes (C, C#) are controllably coupled, respectively, to the bit line nodes (BL, BL#) through gate transistors M305 and M306. Thus, during a precharge state when both bit line nodes (BL, BL#) are charged High, a Low level will be at either the C or C# storage node with a High at the other storage node. When the word-line node (WL) is asserted (High), gate transistors M305 and M306 turn on thereby discharging the bit line node (BL or BL#) that is coupled to the Low storage node (C or C#).

Unfortunately, read operations can be unstable due, among other things, to a noise spike imposed on the Low bit cell storage node (C or C#) when a bit line is discharged into it. As the selected word-line is asserted causing BL or BL# to discharge into the selected bit cell, a noise bump is imposed at its Low storage node due to voltage division between the bit cells' "Low-side" gate and pull-down transistors. The resistance of the pull-down transistor relative to that of the gate transistor is commonly referred to as cell ratio. The lower the cell ratio, the smaller the bump on the storage node resulting in a more stable read operation on the cell. Accordingly, prior art solutions have involved using cells with sufficiently low cell ratios (i.e., with pull-down transistors having sufficiently lower resistances relative to their associated gate transistors). Other solutions have involved applying a negative voltage as the ground to the pull-down transistors in the cell during an evaluate state.

In this disclosure, a novel approach is presented. It has been observed that as the number of cells on a bit line increase, the overall capacitance of the bit line increases. This prolongs the discharge time, as well as the magnitude and/or duration of a noise bump at the Low node of a selected cell, which can significantly contribute to read instability. With this in mind, some disclosed embodiments presented herein employ segmenting a column's bit line (or bit line pair) into a number of effectively shorter bit lines. This can improve cell stability since the shorter bit lines (with a relatively smaller number of associated bit cells) will generally discharge faster than a bit line with the entire column of bit cells. With such an approach, the magnitude and/or time of a noise event on the Low storage node of a selected cell can be reduced to improve read operation stability. In fact, in some embodiments, even unity ratio cells may be used with relatively long bit cell columns and still have sufficient read operation stability. (It should be recognized that embodiments of the invention do not preclude the use of conventional approaches, including those mentioned above, in combination with novel techniques disclosed herein.)

Figure 4:
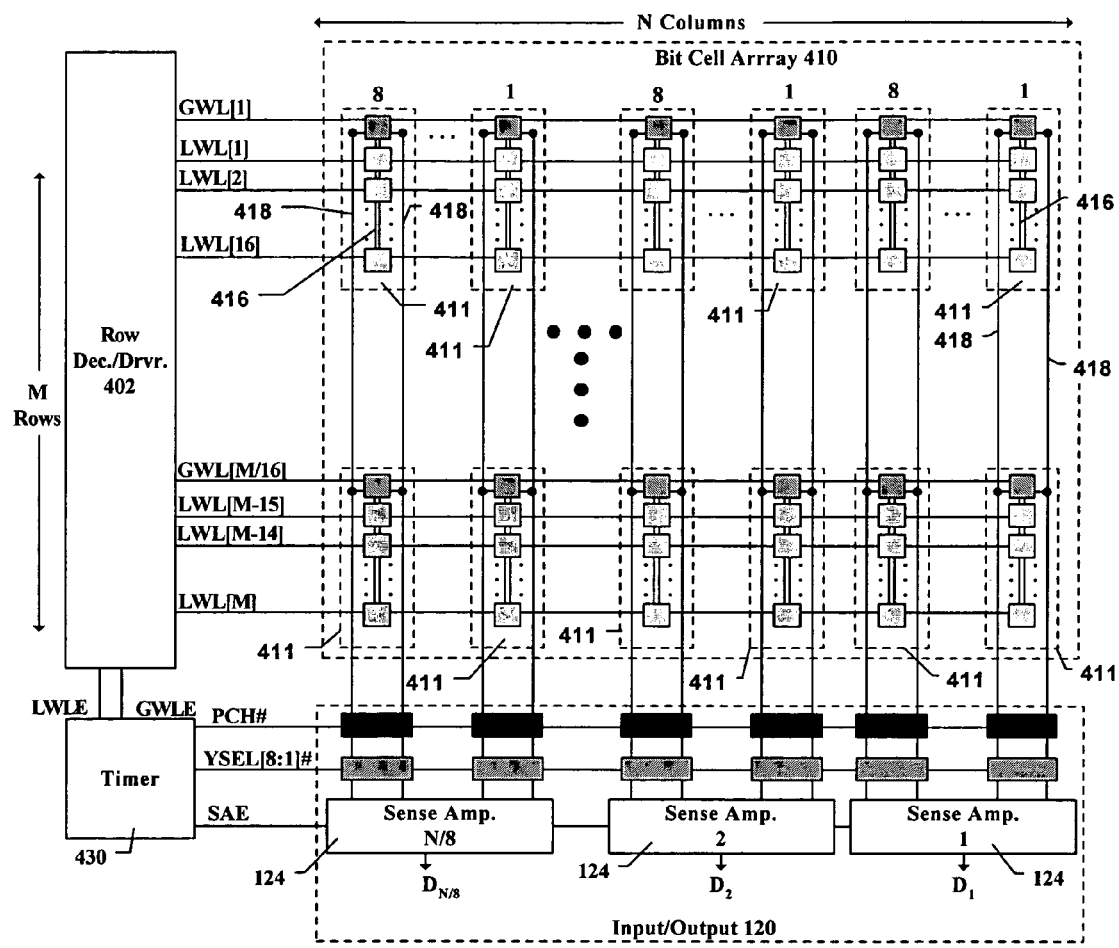
FIG. 4 is a schematic diagram of a memory array circuit according to some embodiments of the present invention.

With reference to FIG. 4, one embodiment of a memory array with a segmented bit cell column is depicted. The depicted memory array generally comprises a row decoder/driver 402, a bit cell array 410, an input/output circuit 120, and a timer circuit 430.

The bit cell array 410 comprises an M by N array of bit cells 112. Each of the N bit cell columns comprises a global bit line pair 418 and local bit cell groups 411 also coupled to the global bit line pair 418. Each local bit cell group 411 comprises a local bit line pair 416, bit cells 112 controllably coupled to the local bit line pair 416, and a local precharge/gate circuit 414. The local precharge/gate circuit 414 is coupled to both the global and local bit line pairs 418, 416 to precharge the local bit line pair 416 during a precharge state and to controllably couple it to the global bit line pair 418. In the depicted embodiment, there are 16 bit cells per local bit cell group 411. Accordingly, there are M/16 different bit cell groups 411. For example, with a 256 by 256 bit cell array, each bit cell column would include 32 different local bit cell groups 411. (Note, that in this embodiment, there are an equal number of 16 bit cells in each local bit cell group 411. Other embodiments, however, could utilize local bit cell groups with smaller or larger numbers of bit cells in each local bit cell group depending upon particular design objectives. In addition, the sizes (number of bit cells) of the different local bit cell groups in a memory array could be equal or different from one to another.)

The row decoder/driver 402 provides a unique global word line signal (GWL[i]) to each row of local bit cell groups 411 for activation of a selected one of them. It also provides a local word line signal (LWL[i]) to each row of bit cells 112 for activation of a selected one of them within the selected local bit cell group 411. (Note that in the depicted embodiment, only one row of local bit cell groups 411 and one row of bit cells 112 is selected at a time. It is contemplated, however, that in other embodiments, rows of bit cells in different local bit cell groups could be selected at the same time since they would be coupled to different local bit lines.)

The timer circuit 430 provides a precharge signal (PCH#) that is asserted (Low) for activating the global precharge circuits 121 to charge the global bit line pairs 418 during a precharge state. The timer 430 also provides global word line enable (GWLE) and local word line enable (LWLE) signals for separately enabling the global and local word line signals from the row decoder/driver 402. In addition, it provides a column select (YSEL[i]) and sense amplifier enable (SAE) signals to control column select gates 122 and sense amplifiers 124, respectively, for reading desired bit cell columns.

Figure 5:
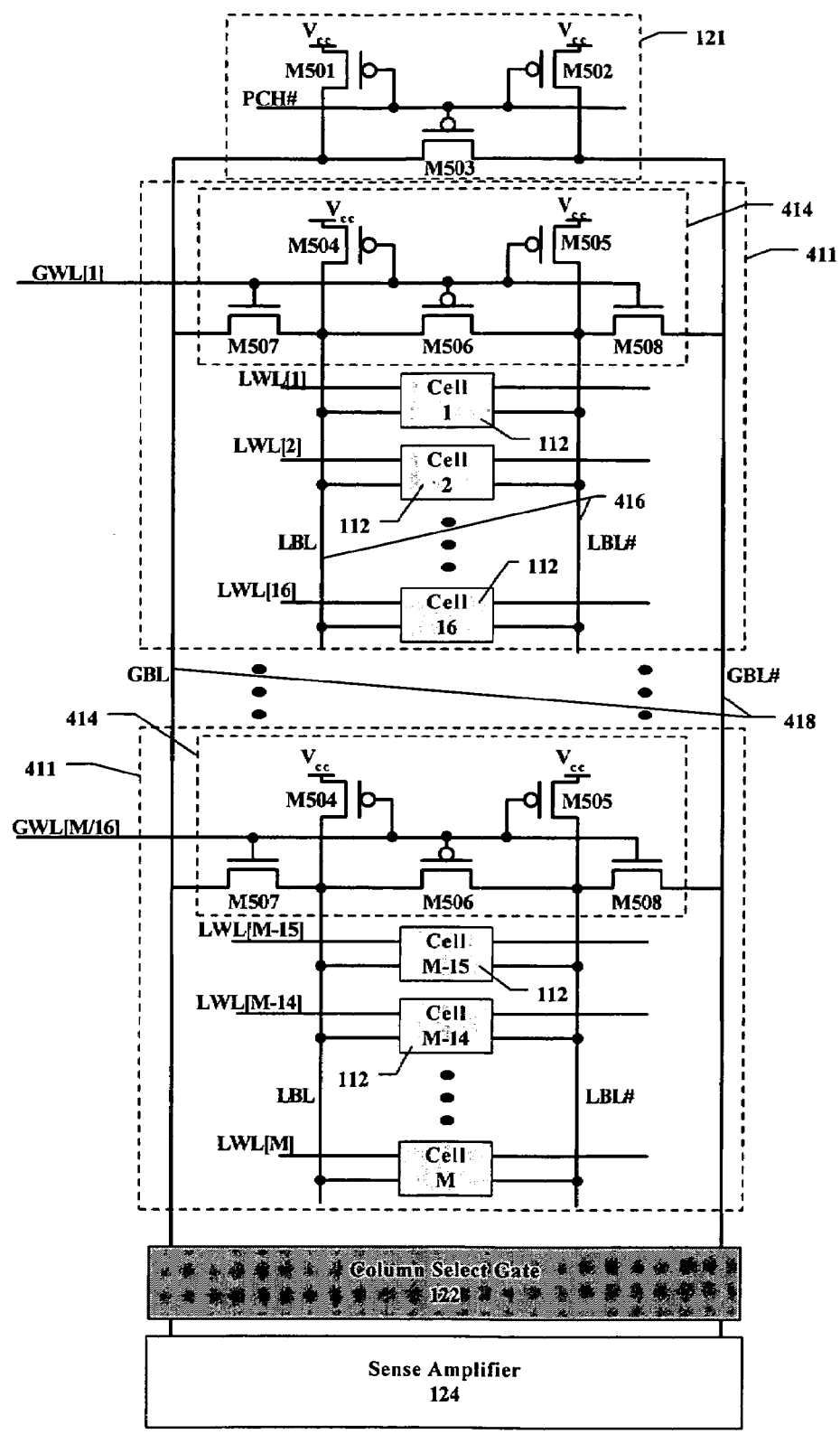
FIG. 5 is a schematic diagram of an embodiment of a bit cell column, which may be used in the memory array circuit of FIG. 4.

FIG. 5 shows an embodiment of a bit cell column embodiment that may be used to implement the bit cell columns in the bit cell array 410 of FIG. 4. The depicted bit cell column comprises a global bit line pair 418 (with complementary global bit lines GBL, GBL#), along with a global precharge circuit 121 and local bit cell groups 411 coupled to the global bit line pair 418. It also comprises a column select gate 122 that controllably couples a sense amplifier 124 to the global bit line pair 418. Each local bit cell group 411 comprises a local bit line pair 416 (with complementary local bit lines LBL, LBL#), bit cells 112 controllably coupled to the local bit line pair 416, and a local precharge/gate circuit 414 coupled to both the global bit line pair 418 and the local bit line pair 416 within the local bit cell group 411. A separate global word line signal (GWL[i]) is applied to a local precharge/gate circuit 414 in each local bit cell group 411 for selection of local bit cell groups 411 in a row. (Thus, with the depicted embodiment, there are 16 different GWL[i] signals—one for each row of local bit cell groups.) Likewise, a separate local word line signal (LWL[i]) is applied to each row of bit cells 112. (Thus, with the depicted embodiment, there would be M different local word line signals, LWL[i]).

The precharge circuit 121 comprises PFET transistors M501 to M503 coupled between the complementary bit lines (GBL, GBL#) of the global bit line pair 418 and a suitable precharge voltage (e.g., $V_{cc}$) for precharging the global bit line pair 418. The precharge signal (PCH#) is applied to the gates of each of these precharge transistors M501 to M503. Thus, when PCH# is asserted (Low), transistors M501 to M503 turn on thereby coupling the precharge voltage to the global bit lines (GBL, GBL#) and equalizing them with one another.

Within each local bit cell group 411, a local precharge/gate circuit 414 is coupled to both the local and global bit line pairs to charge the local bit line pair during a precharge state and to controllably couple the local bit line pair to the global bit line pair. The depicted local precharge/gate circuits comprise precharge PFET transistors M504 to M506 and gate NFET transistors M507, M508. The precharge transistors M504 to M506 are coupled between the local bit lines (LBL, LBL#) and a suitable precharge voltage (e.g., $V_{cc}$). The gate transistor M507 is coupled between local and global bit lines (LBL, GBL), while the gate transistor M508 is coupled between local and global bit lines (LBL#, GBL#). The global word line signal (GWL[i]) is applied to the gates of each of these transistors. During a precharge state, the GWL[i] signals are negated (Low) thereby precharging all of the local bit pairs 416 and decoupling them from the global bit line pair 418. On the other hand, during an evaluate state, if its local bit cell group 411 is selected, GWL[i] is asserted (High) turning off the precharge transistors (M504 to M506) and turning on gate transistors M507, M508 to couple the selected local bit cell group's local bit line pair 416 to the global bit line pair 418. Thus, with this embodiment, a single control signal (GWL[i]) can be used for each local bit cell group 411 to control both precharging its local bit line pair and coupling/de-coupling it to/from the global bit line pair. (It should be appreciated that in other embodiments, different and/or separate circuits, e.g., with separate control signals, could also be used for implementing these separate precharge and gating functions.)

Figure 6:
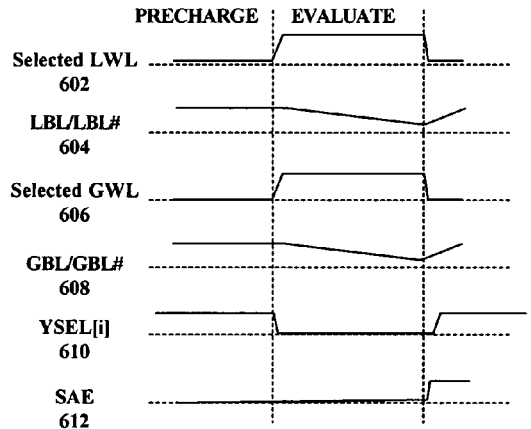
FIG. 6 is a timing diagram indicating one embodiment of operation for the memory array circuit of FIG. 4.

FIG. 6 shows a timing diagram for performing one embodiment of a read operation for the memory array of FIGS. 4 and 5. In this diagram, signals are shown for the selected local word line (LWL[i]) 602, the discharging local bit line (LBL or LBL#) 604, the selected global word line (GWL[i] signal 606, the discharging global bit line (GBL or GBL#) 608, the column select signal (YSEL[i]) 610, and the sense amplifier enable signal (SAE) 612. (Note that the description regarding this diagram is directed to operation of a single bit cell column for simplicity, but the same operation applies to each column in an array.) As indicated in the figure, during a precharge state, the local and global word line signals (LWL[i], GWL[i]) are negated to precharge both the global bit line pair 418 and each of the local bit line pairs 416 for the entire column. Next, during an evaluate state, one selected local word line (LWL[i]), corresponding to a selected bit cell, and one selected global word line (GWL[i]), corresponding to a local bit cell group containing the selected bit cell, are asserted (High), as indicated at 602 and 606. (Note that in this embodiment, they are substantially asserted together.) Depending on the memory contents of the selected bit cell, either the LBL and GBL bit lines or the LBL# and GBL# bit lines will discharge into the selected bit cell and thus, will droop, as indicated at 604 and 608. Next, at the beginning of the next precharge state, the column select signal (YSEL[i]) is asserted (Low) to couple the "evaluated" global bit line pair 418 through to the sense amplifier 124, which is enabled with the assertion (High) of the sense amplifier enable signal (SAE). The sense amplifier "reads" the logic value on the global bit line pair and provides the value at its output ($D_k$). (Note that in this embodiment, the sense amplifier reads the global bit line pair at the beginning of a next precharge state. It should be appreciated, however, that it could be read at a different, appropriate phase of a clock cycle. For example, it could be read at the end of an evaluate state or during a different, e.g., third state of a clock cycle.)

Figure 7:
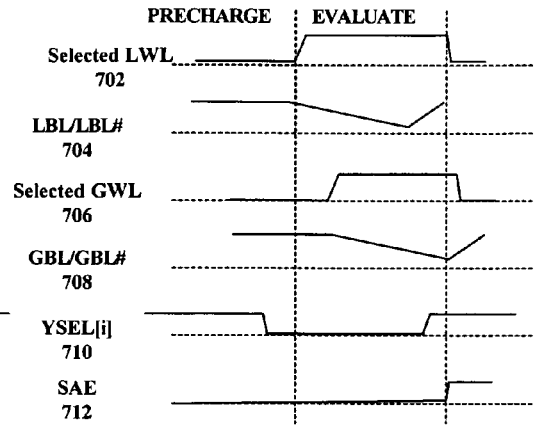
FIG. 7 is a timing diagram indicating another embodiment of operation for the memory array circuit of FIG. 4.

FIG. 7 depicts an alternative timing scheme for performing a read operation. The signals function the same as in FIG. 6 except that the assertion of the selected global word line signal (GWL[i]) 706 is delayed from the assertion of the selected local word line signal (LWL[i]) 702 by an amount to allow the discharging local bit line to suitably discharge before it is coupled to the global bit line. By imposing this delay, the extra capacitance of the global word line is temporarily "hidden" from the selected bit cell, which results in an even faster local bit line discharge thereby reducing the noise bump at the selected cell and decreasing even further the likelihood that the cell will errantly "flip."

Additional Remarks

It should be appreciated that the present invention is applicable for use with all types of semiconductor integrated circuit ("IC") chips. Examples of these IC chips include but are not limited to processors, controllers, chip set components, programmable logic arrays (PLA), and memory chips.

Figure 8:
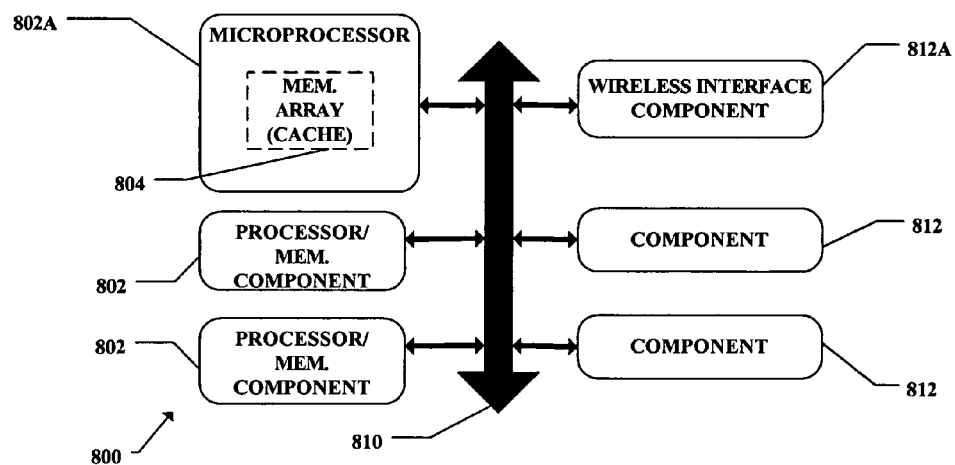
FIG. 8 is a block diagram of a system having a processor chip with a memory array circuit according to some embodiments of the present invention.

With reference to FIG. 8, one example of a system (system 800 for a computer) that may be implemented with one or more IC chips or modules (including a microprocessor chip 802A) is shown. System 800 generally comprises one or more processor/memory components 802, an interface system 810, and one or more other components 812. At least one of the one or more processor/memory components 802 is communicatively linked to at least one of the one or more other components 812 through the interface system 810, which comprises one or more interconnects and/or interconnect devices including point-to-point connections, shared bus connections, and/or combinations of the same.

A processor/memory component is a component such as a processor, controller, memory array, or combinations of the same contained in a chip or in several chips mounted to the interface system or in a module or circuit board coupled to the interface system. Included within the depicted processor/memory components is microprocessor chip 802A, which has a cache memory array 804 with one or more segmented bit cell columns, as disclosed herein. The one or more depicted other components 812 could include any component of use in a computer system such as a sound card, network card, Super I/O chip, or the like. In the depicted embodiment, the other components 812 include a wireless interface component 812A, which serves to establish a wireless link between the microprocessor 802A and another device such as a wireless network interface device or a computer. It should be noted that the system 800 could be implemented in different forms. That is, it could be implemented in a single chip module, a circuit board, or a chassis having multiple circuit boards. Similarly, it could constitute one or more complete computers or alternatively, it could constitute a component useful within a computing system.

While the inventive disclosure has been described in terms of several embodiments, those skilled in the art will recognize that the invention is not limited to the embodiments described, but can be practiced with modification and alteration within the spirit and scope of the appended claims. For example, while the discussed embodiments used bit cell columns with complementary bit line pairs, other embodiments could use different bit line configurations such as those with a single dischargeable bit line, depending upon a particular technology or application.

Moreover, it should be appreciated that example sizes/models/values/ranges may have been given, although the present invention is not limited to the same. As manufacturing techniques (e.g., photolithography) mature over time, it is expected that devices of smaller size could be manufactured. With regard to description of any timing or programming signals, the terms "assertion" and "negation" are used in an intended generic sense. More particularly, such terms are used to avoid confusion when working with a mixture of "active-low" and "active-high" signals, and to represent the fact that the invention is not limited to the illustrated/described signals, but can be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A circuit, comprising:
   (a) a global bit line; and
   (b) local bit cell groups coupled to the global bit line, each local bit cell group comprising:
      (i) a local bit line and bit cells controllably coupled to the local bit line, the local bit line being controllably coupled to the global bit line and comprising a complementary pair of bit lines to be precharged at substantially the same level, wherein the bit cells have substantially unity cell ratios.
      (ii) a local precharge circuit coupled to its associated local bit line to charge the bit line during a precharge state, and
      (iii) one or more gates to controllably couple its associated local bit line to the global bit line, wherein the local precharge circuit and one or more gates are part of a common precharge/gate circuit controlled by a common control signal; and
   (c) a global precharge circuit coupled to the global bit line for charging it during the precharge state.

2. The circuit of claim 1, in which the bit cells are complementary output SRAM cells.

3. The circuit of claim 1, in which the global bit line is a bit line within a pair of complementary bit lines.

4. The circuit of claim 3, in which the local bit lines are part of local bit line pairs that are controllably coupled to the global bit line pair through one or more gates.

5. A chip comprising a memory array with the circuit in accordance with the circuit of claim 1.

* * * * *